United States Patent
Kosugi et al.

(10) Patent No.: US 9,885,760 B2
(45) Date of Patent: Feb. 6, 2018

(54) BATTERY APPARATUS AND BATTERY SYSTEM

(71) Applicant: KABUSHIKI KAISHA TOSHIBA, Minato-ku (JP)

(72) Inventors: Shinichiro Kosugi, Yokohama (JP); Masahiro Sekino, Tokyo (JP); Masayuki Hoshino, Yokohama (JP); Hiroaki Sakurai, Kawasaki (JP); Tomokazu Morita, Funabashi (JP); Takenori Kobayashi, Tokyo (JP); Tomohiro Toyosaki, Fuchu (JP); Masatake Sakuma, Tokyo (JP); Takahiro Yamamoto, Fuchu (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/068,168

(22) Filed: Mar. 11, 2016

(65) Prior Publication Data
US 2016/0195590 A1  Jul. 7, 2016

Related U.S. Application Data

(63) Continuation of application No. PCT/JP2014/074974, filed on Sep. 19, 2014.

(51) Int. Cl.
*G01R 31/36* (2006.01)
*H01M 10/42* (2006.01)
*H01M 10/48* (2006.01)

(52) U.S. Cl.
CPC ....... *G01R 31/3679* (2013.01); *G01R 31/362* (2013.01); *G01R 31/3624* (2013.01);
(Continued)

(58) Field of Classification Search
CPC ..... H02J 7/0016; H02J 7/007; Y02T 10/7055; H01M 10/482; H01M 2010/4271; H01M 2/206; G01R 31/3662; G01R 31/368
See application file for complete search history.

(56) References Cited

U.S. PATENT DOCUMENTS

| 2002/0105303 A1* | 8/2002 | Kishi | H02J 7/0047 320/134 |
| 2004/0155629 A1* | 8/2004 | Kobayashi | H02J 7/0016 320/127 |

(Continued)

FOREIGN PATENT DOCUMENTS

| JP | 9-113588 | 5/1997 |
| JP | 2002-236154 | 8/2002 |

(Continued)

OTHER PUBLICATIONS

English translation of International Search Report dated Nov. 25, 2014 in PCT/JP2014/074974.
(Continued)

*Primary Examiner* — Mirza Alam
(74) *Attorney, Agent, or Firm* — Oblon, McClelland, Maier & Neustadt, L.L.P.

(57) ABSTRACT

According to one embodiment, there is provided a battery apparatus including a battery management device configured to receive voltages and temperatures of cells, and detection data of a current sensor, and a measuring computer configured to calculate a characteristic value of each cell or cell module, based on the detection data acquired from the battery management device at first time intervals, and to send, the acquired detection data or the calculated characteristic value to a control device at second time intervals which are longer than the first time intervals.

5 Claims, 5 Drawing Sheets

(52) U.S. Cl.
CPC ....... *H01M 10/425* (2013.01); *H01M 10/482* (2013.01); *H01M 10/486* (2013.01); *G01R 31/3658* (2013.01); *G01R 31/3662* (2013.01); *G01R 31/3689* (2013.01); *H01M 2010/4271* (2013.01)

(56) References Cited

U.S. PATENT DOCUMENTS

| | | | | |
|---|---|---|---|---|
| 2005/0127873 | A1* | 6/2005 | Yamamoto | H02J 7/0016 320/116 |
| 2008/0204031 | A1* | 8/2008 | Iwane | G01R 31/3624 324/430 |
| 2010/0010704 | A1* | 1/2010 | Uchida | B60L 3/0046 701/29.6 |
| 2010/0019725 | A1* | 1/2010 | Nakatsuji | H02J 7/0016 320/118 |
| 2013/0335030 | A1* | 12/2013 | Joe | H01M 10/052 320/134 |

FOREIGN PATENT DOCUMENTS

| | | |
|---|---|---|
| JP | 2008-154317 | 7/2008 |
| JP | 2010-22155 | 1/2010 |
| JP | 2011-128010 | 6/2011 |
| JP | 2011-238010 A | 11/2011 |
| JP | 2013-70441 | 4/2013 |
| JP | 2013-73897 | 4/2013 |
| JP | 2013-97926 | 5/2013 |
| JP | 2013-208020 | 10/2013 |
| JP | 2014-41747 | 3/2014 |
| JP | 2014-54148 | 3/2014 |
| JP | 2014-132243 | 7/2014 |

OTHER PUBLICATIONS

Korean Office Action dated Aug. 23, 2016 in Patent Application No. 10-2016-7005242 (with English translation).
International Search Report dated Nov. 25, 2014 in PCT/JP2014/074974 filed Sep. 19, 2014 (with English Translation of Categories of Cited Documents).
Written Opinion dated Nov. 25, 2014 in PCT/JP2014/074974 filed Sep. 19, 2014.
Japanese Office Action dated Apr. 4, 2017 in Patent Application No. 2016-503244.

* cited by examiner

BATTERY APPARATUS AND BATTERY SYSTEM

CROSS-REFERENCE TO RELATED APPLICATIONS

This application is a Continuation Application of PCT Application No. PCT/JP2014/074974, filed Sep. 19, 2014, the entire contents of all of which are incorporated herein by reference.

FIELD

Embodiments of the invention relate to a battery apparatus and a battery system.

BACKGROUND

A secondary cell gradually deteriorates after manufacture, and degradation occurs in characteristics, such as a decrease in capacity or a rise in resistance. The degradation of the cell affects a system which uses the cell. When the degradation is great, the cell capacity or output characteristics, which the system requires, fail to be satisfied, and there is concern that the operation of the system stops. Thus, it is important to estimate the degradation of the cell. Specifically, it is desirable that the system, which uses the cell, be capable of detecting the life of the cell. It is known that the speed of degradation of the cell varies depending on the method of use of the cell (e.g. the temperature of the environment, the range of charge/discharge), and some methods of estimating the degradation of the cell have been proposed.

There is a demand for the development of a large-scale battery apparatus which can supply large power, as a future battery apparatus. For example, there is a large-scale battery apparatus having a battery capacity of MWh or several-ten MWh class, which utilizes cells with a cell capacity of about 100 Wh. In this case, such a design is needed that 10,000 to 100,000 cells are combined in series or in parallel, in accordance with the required output voltage or current capacity.

In order to diagnose the degradation of each of cell modules which are mounted in the above-described large-scale battery apparatus, it is necessary to calculate the state of charge (SOC) or internal resistance value of the cell module as characteristic values for degradation diagnosis. Conventionally, a control device, which is configured to execute mutual communication with each cell module for the operation of the battery apparatus, calculates the above-described characteristic values for degradation diagnosis, in addition to executing the mutual communication.

However, since the load on the calculation of characteristic values for the degradation diagnosis becomes greater in accordance with the number of cell modules that are targets of diagnosis, this load becomes a cause of a delay or error in mutual communications for operations. Thus, a problem arises with the maintenance of safety in operation.

DETAILED DESCRIPTION

In general, according to one embodiment, there is provided a battery apparatus including a plurality of assembled battery units, each of the assembled battery units including a cell module circuit in which a plurality of cell modules are connected in series, each of the cell modules including a plurality of cells which are connected in series and a cell monitoring unit configured to monitor voltages and temperatures of the plurality of cells, a current sensor for detecting a current flowing in the cell module circuit; and a battery management device configured to receive monitor data from each of the cell monitoring units, and detection data of the current sensor. The battery apparatus includes a gateway control device configured to execute mutual communication with the battery management devices in the plurality of assembled battery units. The battery apparatus includes a measuring computer connected to the gateway control device and the plurality of battery management devices, and configured to acquire detection data from the battery management device at first time intervals, to calculate a predetermined characteristic value of each cell or cell module, based on the acquired detection data, and to send, the acquired detection data or the calculated characteristic value of the cell or cell module to a control device at second time intervals which are longer than the first time intervals.

Embodiments will be described hereinafter with reference to the accompanying drawings.

Figure 1:
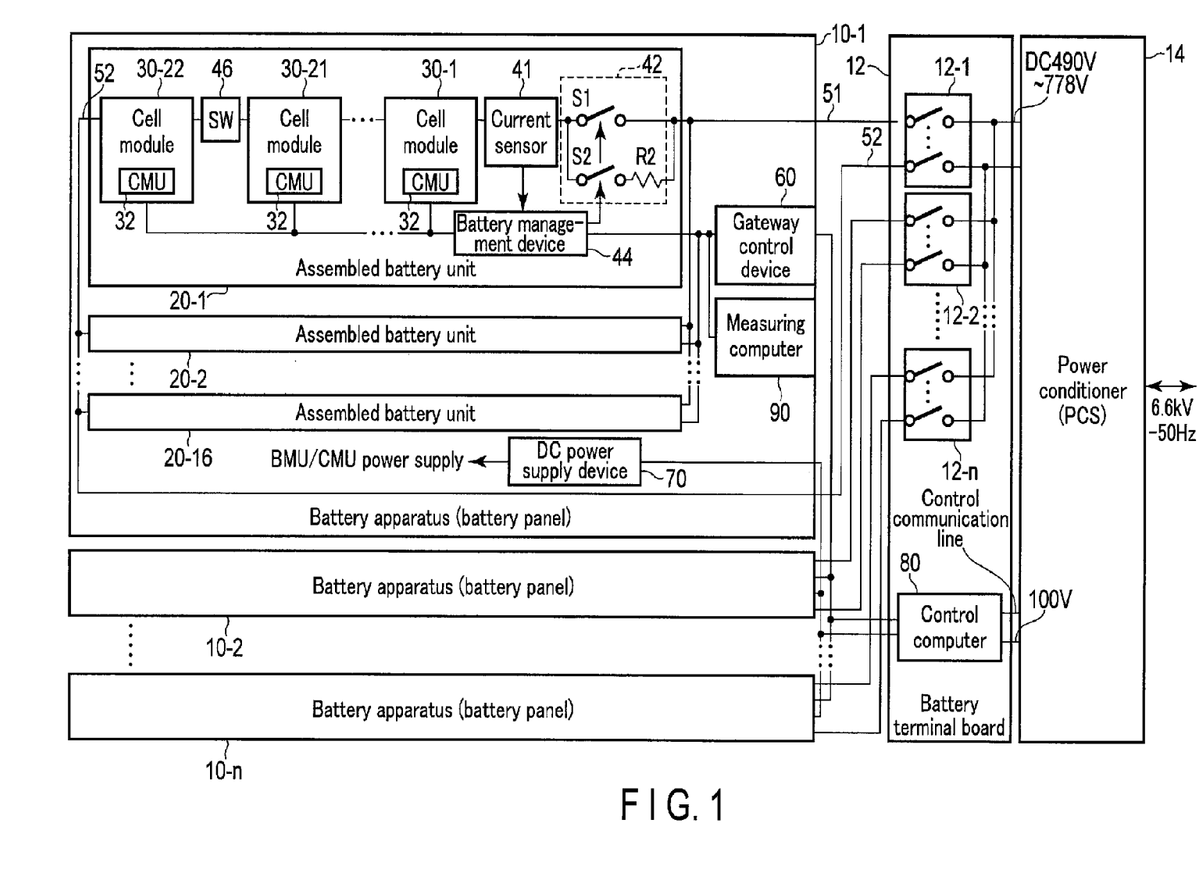
FIG. 1 is a block diagram illustrating an example of the configuration of a large-scale battery apparatus in an embodiment.

FIG. 1 is a block diagram illustrating an example of the configuration of a large-scale battery apparatus in an embodiment.

Referring to FIG. 1, the outline of the entire system of the large-scale battery apparatus relating to the embodiment is described.

In FIG. 1, 10-1, 10-2, ..., 10-$n$ denote battery apparatuses (which may also be referred to as "battery panels"). These may comprehensively be referred to as "battery apparatus 10". The battery apparatuses 10-1, 10-2, ..., 10-n have the same configuration, and, for example, 16 battery apparatuses are prepared. In the Figure, the internal configuration of one battery apparatus 10-1 is representatively illustrated.

The battery apparatus 10-1 includes charge/discharge terminals 51, 52. For example, the charge/discharge terminal 51 is a positive terminal, and the charge/discharge terminal 52 is a negative terminal. The charge/discharge terminals 51, 52 are connected to a breaker 12-1 of a battery terminal board 12. The battery terminal board 12 includes breakers 12-1, 12-2, ..., 12-n which correspond to the battery apparatuses 10-1, 10-2, ..., 10-n. The breakers 12-1, 12-2, ..., 12-n are manually opened/closed and operated. The positive terminals of the breakers 12-1, 12-2, ..., 12-n are commonly connected. In addition, the negative terminals of the breakers 12-1, 12-2, ..., 12-n are commonly connected.

The common connection of the positive terminals means a state in which the positive terminals are bundled together. The common connection of the negative terminals means a state in which the negative terminals are bundled together. The direct current (DC) voltage between the positive and negative terminals of the battery terminal board 12 is set at, for example, about 490 V to 778 V. In addition, the battery terminal board 12 includes a control computer 80 (to be described later). The control computer 80 is implemented by a processor, for example, a CPU.

The DC voltage, which is output from the battery terminal board 12, is supplied to a power conditioner (PCS) 14. The power conditioner 14 boosts the DC voltage by switching the DC voltage, and generates an alternating current (AC) output. The AC output is, for example, 6.6 kV at 50 Hz. The output of the power conditioner 14 is supplied to a power supply line of an external power system. The power conditioner 14 has a bidirectional AC/DC conversion function which transfers power between the power system and the battery. In addition, the output of the power conditioner 14 is supplied to DC power supply devices of the battery apparatuses 10-1, 10-2, ..., 10-n via the control computer 80. In FIG. 1, a DC power supply device 70 in the battery apparatus 10-1 is representatively illustrated.

Next, the internal configuration of the battery apparatus 10-1 is described. The battery apparatus 10-1 includes a plurality (e.g. 16) of assembled battery units 20-1, 20-2, ..., 20-16 which are connected in parallel. Since the assembled battery units 20-1, 20-2, ..., 20-16 have the same configuration, the internal configuration of the assembled battery unit 20-1 is representatively illustrated in FIG. 1.

The configuration of the assembled battery unit 20-1 is described. The assembled battery unit 20-1 includes a plurality (e.g. 22) of cell modules 30-1, 30-2, ..., 30-22 which are connected in series. These are comprehensively referred to also as "cell module circuit 30". A switch 46 may be provided at a point along a series circuit which is composed of the cell modules 30-1, 30-2, ..., 30-22. This switch 46 is used in order to turn off the series circuit, for example, when any one of the cell modules is removed for an inspection. In addition, in some cases, the switch 46 serves also as a disconnector (service disconnect), or may be a fuse. In addition, in some cases, wiring is formed in order to notify a battery management device 44 (BMU: Battery Management Unit) (to be described later) of the connection/disconnection state or the state of the fuse. The battery management device 44 is implemented by a processor, for example, a CPU.

The above-described cell modules 30-1, 30-2, ..., 30-22 have the same configuration. Each of the cell modules 30-1, 30-2, ..., 30-22 includes at least a plurality of cells which are connected in series, and a battery monitoring unit 32 which monitors temperatures and voltages of the plural cells. The battery monitoring unit 32 is implemented by a processor, for example, a CPU.

These cells have such characteristics that the capacity decreases by degradation due to the passing of time, or degradation due to repetition of charge/discharge, and that the internal resistance at a time of charge and the internal resistance at a time of discharge in relation to the SOC (state of charge) increase.

Figure 2:
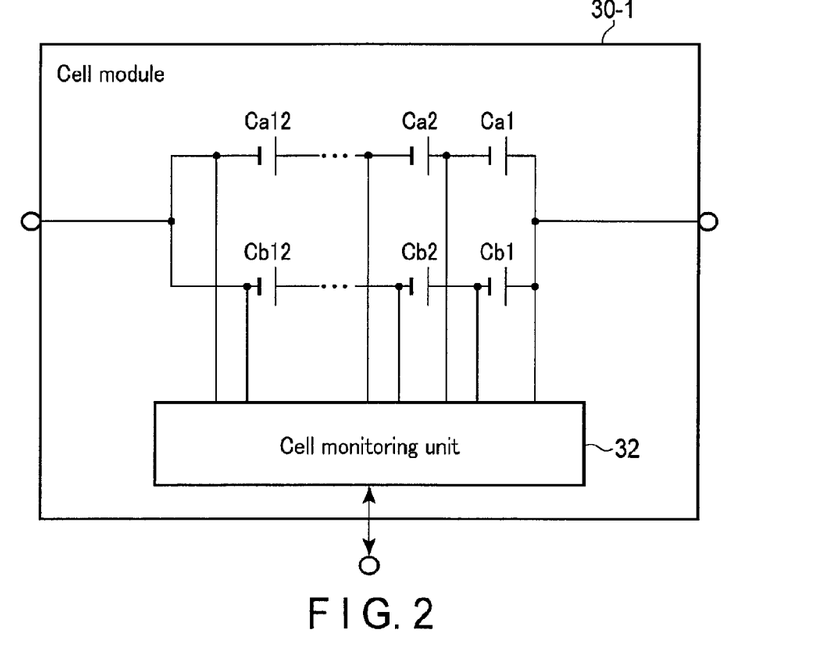
FIG. 2 is a view which schematically illustrates the inside of the cell module which is provided in the large-scale battery apparatus in the embodiment.

FIG. 2 is a view which schematically illustrates the inside of the cell module which is provided in the large-scale battery apparatus in the embodiment. FIG. 2 illustrates, in a simplified fashion, the internal configuration of the cell module, which is represented by the cell module 30-1.

In the cell module 30-1, a first cell circuit, which is composed of a plurality (e.g. 12) of series-connected cells Ca1 to Ca12, and a second cell circuit, which is composed of a plurality (e.g. 12) of series-connected cells Cb1 to Cb12, are connected in parallel, and constitute a parallel circuit. The cell is, for example, a lithium ion secondary cell, and use is made of a cell with a cell capacity of about several-ten Wh to several-hundred Wh (e.g. an average voltage 2 [V] to 5 V×output current 3 [A] to 100 Ah). A positive terminal and a negative terminal of the parallel circuit are led out.

In addition, a cell monitoring unit (CMU) 32 is provided in the cell module 30-1. The cell monitoring unit 32 monitors (senses or detects) the terminal voltage of each cell. Furthermore, the cell monitoring unit 32 can detect the temperature of each cell, or the temperature in the cell module. Moreover, the cell monitoring unit 32 includes a controller which includes therein a microprocessor, and includes a transceiver for communicating with the outside.

Referring back to FIG. 1, the configuration of the inside of the assembled battery unit 20-1 is described. A current sensor 41 is connected to one terminal of the series circuit in which the plural cell modules 30-1, ..., 30-21, 30-22 are connected in series. In addition, one of input/output terminals of a switch circuit 42 (electromagnetic contactor) is connected to one terminal of the series circuit. Further, the other of the input/output terminals of the switch circuit 42 is provided with a first charge/discharge terminal 51. Besides, the other terminal of the series circuit, in which the plural cell modules 30-1, ..., 30-21, 30-22 are connected in series, is provided with a second charge/discharge terminal 52.

In the switch circuit 42, a switch S1 with no resistance (with an extremely smaller resistance value than a resistor R2; e.g. a resistance value of ⅒ or less) and a switch S2, which is connected to the resistor R2 in series, are connected in parallel.

In FIG. 1, the switch circuit 42 is provided between the charge/discharge terminal 51 and the current sensor 41. However, an additional switch circuit is provided between the charge/discharge terminal 52 and the cell module 30-22. This aims at securing safety, even if one of the switch circuits fails to open due to contact fusion-bond or the like, by making the other switch circuit "open".

Here, the cell monitoring units 32 in the cell modules 30-1, 30-2, ..., 30-22 are connected to the battery management device 44 via a communication bus line such as a CAN (Control Area Network) line, and can execute mutual communication. In addition, the current sensor 41 is connected to the battery management device 44. The battery management device 44 can receive current data which the current sensor 41 measures.

The battery management device 44 includes a controller including a microprocessor, and also includes a transceiver for communicating with the cell monitoring unit 32. Further, the battery management device 44 can output control signals for controlling the switches S1 and S2 of the switch circuit 42.

In addition, the battery management device 44 is connected to a gateway control device 60 (which may also be referred to as "gateway device" or "master control device"), and can execute mutual transmission/reception of various data. For example, the communication between the battery management device 44 and gateway control device 60 is executed at intervals of, e.g. 100 μsec to 200 μsec. The gateway control device 60 can control the operation of the battery management device 44, and the operation of the DC power supply device 70. In short, the gateway control device 60 comprehensively controls the respective assembled battery units 20-1, . . . , 20-16. The gateway control device 60 is implemented by a processor, for example, a CPU.

The gateway control device 60 is provided in each of the battery apparatuses 10-1, 10-2, . . . , 10-n. The gateway control device 60 in each of the battery apparatuses 10-1, 10-2, . . . , 10-n is connected to the control computer 80 via a communication bus line, and can execute mutual communication. The control computer 80 includes a controller including therein a microprocessor, and includes a transceiver for communicating with the outside. In addition, the control computer 80 monitors the states of the breakers 12-1, 12-2, . . . , 12-n. Besides, the gateway control device 60 may reduce the amount of data which is sent to the control computer 80, by executing a process such as thinning out data that is sent from the battery management device 44.

Furthermore, a measuring computer 90 is connected between the gateway control device 60 and battery management device 44.

This measuring computer 90 acquires detection data and SOC data obtained from the battery management device 44, such as voltages and temperatures of respective cells accommodated in each cell module, and the value of current flowing in each cell module. Using these data, predetermined values relating to each cell or each cell module are calculated. For example, the value of internal resistance is calculated by using the current value and voltage value of each accommodated cell or cell module at time intervals. This internal resistance value can be used for degradation diagnosis.

For example, the communication between the measuring computer 90 and control computer 80 is executed with a very low frequency, for example, at intervals of every minute, every hour, every day or every month (second time intervals), compared to the frequency of communication between the battery management device 44 and gateway control device 60, which is executed at normal intervals of 100 μsec (first time intervals). There is no or little influence on the communication between the control computer 80, gateway control device 60, measuring computer 90 and battery management device 44.

In the meantime, it is preferable that the amount of data, which the measuring computer 90 acquires, is greater than the amount of data which is sent to the control computer 80.

As described above, this (large-scale) battery apparatus includes the switch circuit 42 (electromagnetic contactor) which is independently provided in each assembled battery unit. Thus, the connection/parallel-off (release) of each assembled battery unit can be independently executed to/from a DC bus (a line which connects in parallel the output terminals of the assembled battery units). The "parallel-off" or "release" means that a connected state of a battery unit, which is connected to other battery units, is set into a disconnected state in which the battery unit is disconnected, or cut off, from the other battery units.

Accordingly, when an assembled battery unit, which has a large difference between the output voltage thereof (the voltage calculated from the detection value of the current sensor 41) and the voltage of the DC bus at a time of activation, has been detected, the activation of only this detected assembled battery unit can be stopped. For example, in such a case that a cell module of a certain assembled battery unit was detached, or was short-circuited or had a fault, an assembled battery unit which does not include this cell module can be constituted. Alternatively, when a fault occurred in a certain assembled battery unit or in a cell module in the assembled battery unit, it is possible to parallel off only the assembled battery unit in which the fault occurred, and to continue the operation of the battery apparatus as a whole. Even after releasing the battery unit in which the fault occurred, it is possible to request data relating to the battery unit from the measuring computer 90, to acquire the data, and to identify the cause of abnormality at an early stage.

If an abnormal state (fault) occurred (e.g. abnormal temperature information, abnormal current, abnormal voltage drop), this is detected by the battery management device 44. Further, the switch circuit 42 in the assembled battery unit is turned off, and the safety of the entire apparatus can be obtained.

Moreover, the information relating to the number of assembled battery units in the operative state, or the total output capacity thereof, or the residual capacity can be transmitted to the power conditioner 14 or control computer 80 via the gateway control device 60. As this transmission path, various communication networks, such as Ethernet (trademark), can be utilized. The power conditioner 14 converts a DC current, which is sent from each assembled battery unit 20-1, . . . , 20-16 to an AC current.

The power conditioner 14 of the present embodiment can execute a protection operation of the battery system by limiting the power output or stopping the operation of the assembled battery unit or battery apparatus, in accordance with the received information. For example, when the output needs to be kept constant, the output can be suppressed or stopped if an abnormal current is output from the assembled battery unit side. Furthermore, when the output of the assembled battery unit side becomes weaker and there is a possibility of occurrence of a reverse power flow, the operation can be stopped.

As described above, each of the assembled battery units can be independently activated and stopped, and there is provided the means for transmitting the states of these assembled battery units to the gateway control device 60, control computer 80 and power conditioner 14, which are upper-level systems. In addition, the control computer 80 can acquire data from the measuring computer 90, when a predetermined state was detected, or with respect to data selected by a user. The frequency of acquisition of this data is extremely lower than the frequency of timings of the data communication for executing ordinary abnormality detection of each usual assembled battery module or each cell accommodated therein. It is thus possible to perform the acquisition of data in parallel with the abnormality detection function of each cell, each cell module or each assembled battery unit. In this manner, while communication is being performed within the range not exceeding the information processing amount of the communication line connecting the control computer 80 and plural gateway control devices 60, other processes such as degradation diagnosis can be executed, and safety can be maintained even if an arbitrary number of assembled battery units are connected.

As a result, a large-scale battery apparatus with an arbitrary capacity can be obtained by the means which enables parallel connection of assembled battery units, the ON/OFF control of the outputs of which can be independently executed for each unit.

Figure 3:
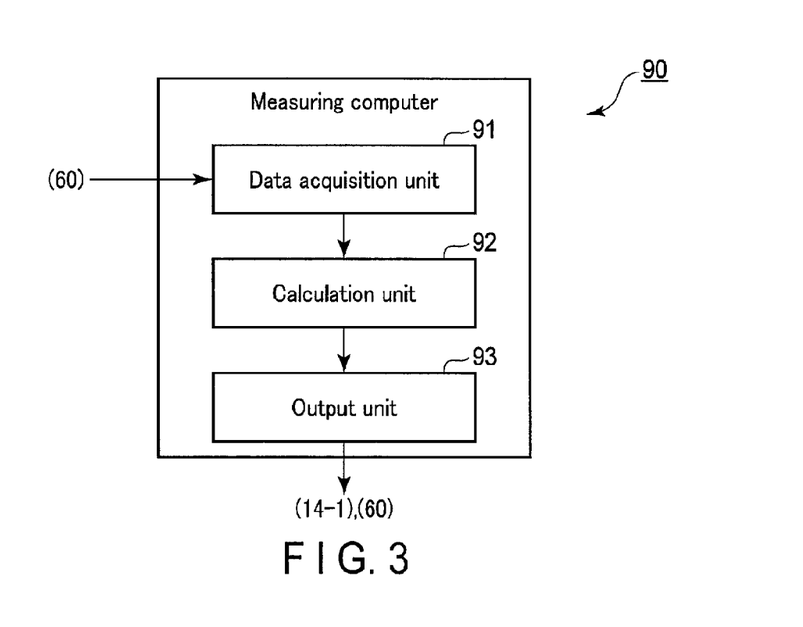
FIG. 3 is a block diagram illustrating a functional configuration example of the measuring computer which is provided in the large-scale battery apparatus in the embodiment.

FIG. 3 is a block diagram illustrating a functional configuration example of the measuring computer which is provided in the large-scale battery apparatus in the embodiment.

As illustrated in FIG. 3, the measuring computer 90 includes a data acquisition unit 91, a calculation unit 92, and an output unit 93. The data acquisition unit 91, the calculation unit 92, and the output unit 93 are implemented by a processor, for example, a CPU.

Figure 4:
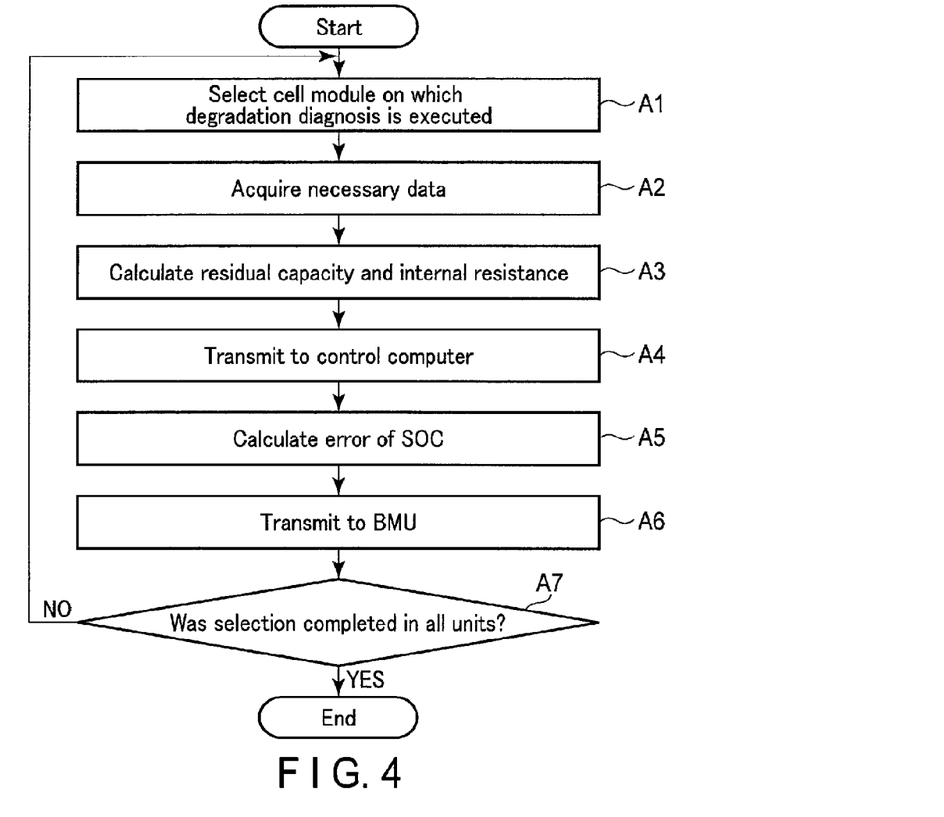
FIG. 4 is a flowchart illustrating an example of a process procedure by the measuring computer provided in the large-scale battery apparatus in the embodiment.

Next, a description is given of a calculation function (degradation diagnosis) of the cell module circuit 30 by the measuring computer 90. FIG. 4 is a flowchart illustrating an example of a process procedure by the measuring computer provided in the large-scale battery apparatus in the embodiment.

The data acquisition unit 91 of the measuring computer 90 selects the cell module 30-1, for instance, as a cell module of a target of degradation diagnosis (A1), and outputs, to the battery management device 44 connected to the cell module 30-1, an instruction for causing the battery management device 44 to output the current, voltage, temperature and SOC of this cell module 30-1.

The data acquisition unit 91 of the measuring computer 90 can preferentially select, as a degradation diagnosis target, a part of cell modules which are connected in series in each assembled battery unit 20. In addition, of the cell modules which are connected in series in each assembled battery unit 20, a cell or cell module having a highest voltage at a time of charge or a lowest voltage at a time of discharge is considered to have a high internal resistance and to be most degraded (the capacity is smallest), and greatly influences the decrease in capacity of the battery unit as a whole. Thus, the data acquisition unit 91 of the measuring computer 90 can preferentially select, as a degradation diagnosis target, the cell module having a highest voltage at a time of charge or a lowest voltage at a time of discharge.

Upon receiving the above-described instruction, the battery management device 44 sends, to the CMU 32 to which the above-described selected cell module 30-1 is connected, an instruction for causing the CMU 32 to transmit the voltage and temperature of the cell module 30-1, thereby reading the information of the voltage and temperature from this CMU 32.

Here, based on the read current and voltage, the battery management device 44 calculates the SOC of the cell module 30-1 at the source of read.

Figure 5:
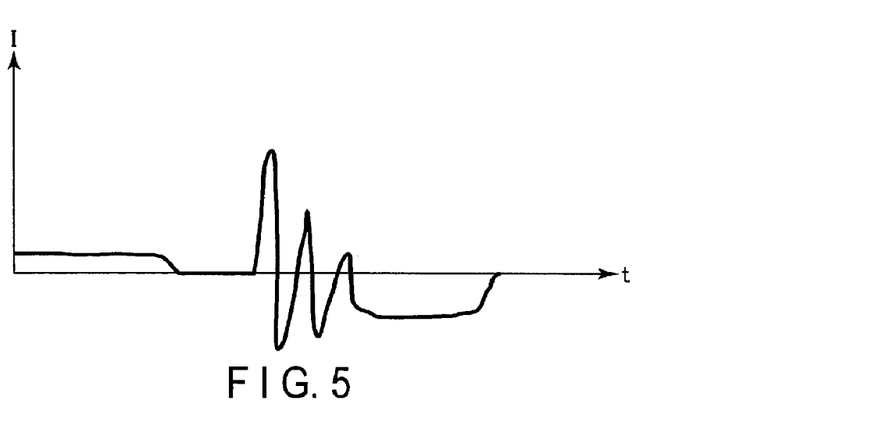
FIG. 5 is a graph illustrating an example of the current characteristic of the cell module provided in the large-scale battery apparatus in the embodiment.
Figure 6:
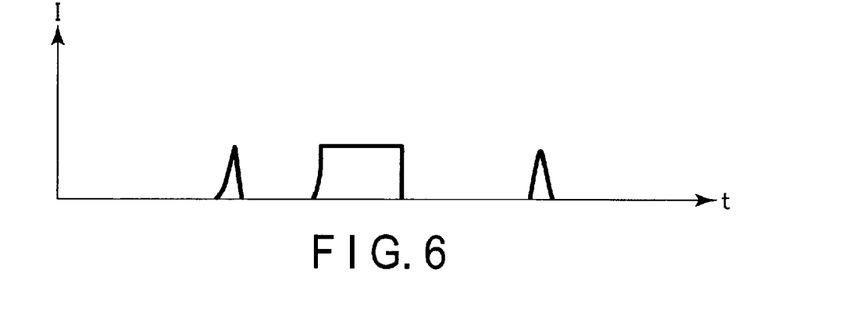
FIG. 6 is a graph illustrating an example of a differential arithmetic result of the current characteristic of the cell module provided in the large-scale battery apparatus in the embodiment.
Figure 7:
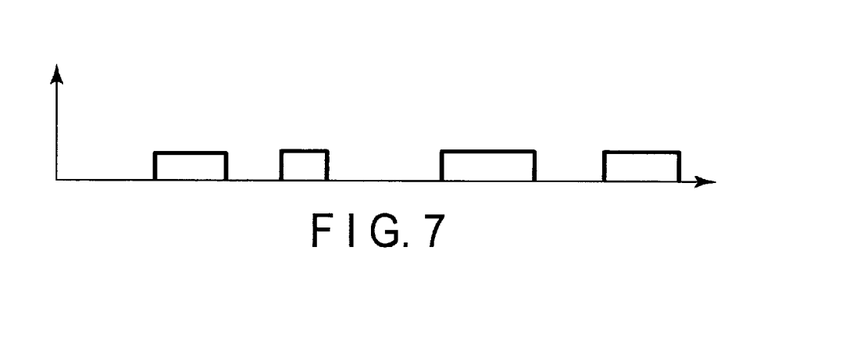
FIG. 7 is a graph illustrating an example of the timing of recording the current characteristic of the cell module provided in the large-scale battery apparatus in the embodiment.

The calculation of the SOC based on a current integration value is described. FIG. 5 is a graph illustrating an example of the current characteristic of the cell module provided in the large-scale battery apparatus in the embodiment. FIG. 6 is a graph illustrating an example of a differential arithmetic result of the current characteristic of the cell module provided in the large-scale battery apparatus in the embodiment. FIG. 7 is a graph illustrating an example of the timing of recording the current characteristic of the cell module provided in the large-scale battery apparatus in the embodiment.

The battery management device 44 monitors the value of a current flowing in the cell module 30-1, which was detected by the current sensor 41, and records in an internal memory the voltage of the cell module 30-1 at a predetermined timing (see FIG. 7) after a predetermined time has passed since the value (see FIG. 6) obtained by integrating this current lowered to a predetermined threshold or less. In FIG. 5 to FIG. 7, the time on the abscissa is identical. On the ordinate of FIG. 7, parts at which the value is not 0 indicate timings of recording the voltage of the cell module 30-1.

The battery management device 44 calculates the SOC of the cell module 30-1, based on the current efficiency, cell capacity (a variable by temperatures) and self-discharge ratio, in addition to the above-described integrated value of the current.

The battery management device 44 classifies, in association with respective temperature ranges, the calculated SOC and the current, voltage and temperature of the cell module 30-1, and sends to the measuring computer 90 the classified data as the data of the current and the voltage of the cell module 30-1 with respect to each SOC.

The data acquisition unit 91 of the measuring computer 90 successively acquires the data of the cell module 30-1, until a necessary number of data for diagnosing the cell module 30-1 that was selected in A1 is obtained (A2).

The calculation unit 92 of the measuring computer 90 calculates, based on the acquired data, the residual capacity and internal resistance value (for each SOC) as the characteristic values for diagnosing the degradation of the cell module 30-1 (A3).

Figure 8:
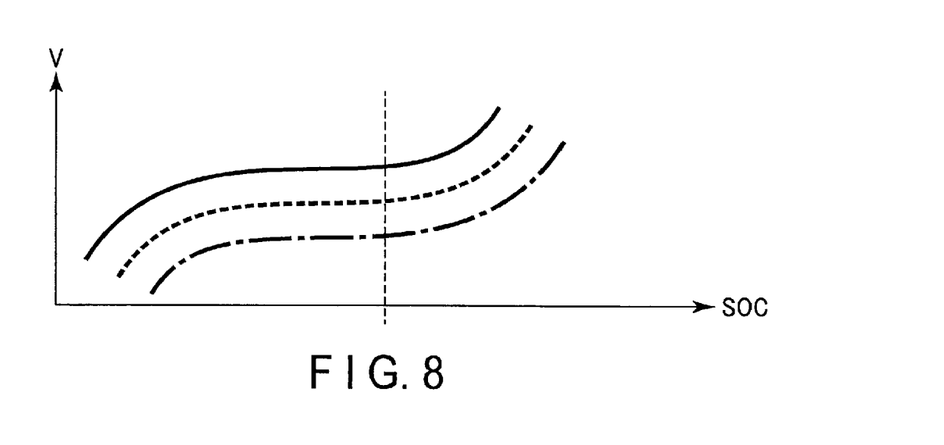
FIG. 8 is a graph illustrating an example of the relationship between the voltage and SOC of the cell module provided in the large-scale battery apparatus in the embodiment.

FIG. 8 is a graph illustrating an example of the relationship between the voltage and SOC of the cell module provided in the large-scale battery apparatus in the embodiment.

Figure 9:
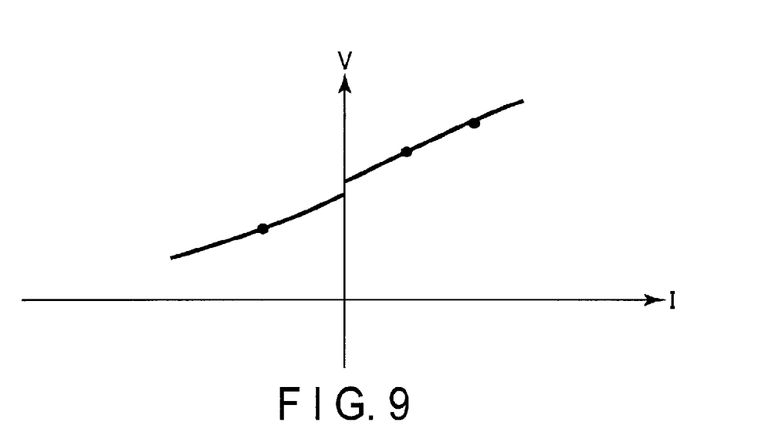
FIG. 9 is a graph illustrating an example of the relationship between the current and voltage of the cell module provided in the large-scale battery apparatus in the embodiment.

FIG. 9 is a graph illustrating an example of the relationship between the current and voltage of the cell module provided in the large-scale battery apparatus in the embodiment.

In the characteristics illustrated in FIG. 8, a voltage curve at arbitrary current values can be obtained by creating a current (I)/voltage (V) plot with respect to each SOC.

Here, if the relationship between the current and voltage at a certain SOC is plotted, the current/voltage plot can be obtained, and, as illustrated in FIG. 9, the voltage of the cell module 30-1 at an arbitrary current value can be obtained. The calculation unit 92 can calculate the internal resistance value, based on the characteristics of the voltage of the cell module 30-1 at an arbitrary current value.

The output unit 93 of the measuring computer 90 outputs the calculation result of the residual capacity and internal resistance value to the control computer 80 (A4).

This calculation result is used for an external instruction value control by the control computer 80. In this manner, by calculating the residual capacity and internal resistance value of the cell module, the instruction value can be determined in accordance with the timing of operational instruction determination of the battery apparatus. Thus, the cell module can be used for a long time.

As regards the SOC based on the current integration value, which was calculated by the battery management device 44, there is a case in which an error due to an offset value of the current sensor 41 increases with the passing of time.

The calculation unit 92 of the measuring computer 90 can estimate an open circuit voltage (OCV) of the cell module 30-1, based on the actual measurement values of the internal impedance, and the voltage and current of the cell module 30-1, and can calculate an error from the SOC based on the current integration value, on the basis of a predetermined relationship between the OCV and SOC (A5).

The value of this error is output from the output unit 93 to the battery management device 44 (A6). In conjunction with this, the battery management device 44 corrects the value of the SOC that was calculated as described above. This correction is executed by each battery management device 44. In this manner, the value of the SOC, which is difficult to exactly recognize due to the accumulation of errors by integration calculations or the effect of transient characteristics of the cell voltage variation relative to the current, is corrected. Thereby, the battery management device 44 can correctly recognize the SOC and residual capacity of the cell module 30-1.

If the selection of the cell module that is the diagnosis target is not completed in all assembled battery units 20 (NO in A7), the cell module that is the diagnosis target is selected from among the cell modules which have not been subjected to the determination of selection/nonselection (A7→A1). In this manner, by successively conducting degradation diagnosis of the cell module, the cell capacity of each cell module can be calculated. Thus, abnormal degradation or an indication of a fault of a specific cell module can be detected, and the battery apparatus can be operated more safely and securely.

Furthermore, the calculation of various data for degradation diagnosis of the cell module circuit 30 is executed by the measuring computer 90 which is provided separately from the control computer 80. Thus, the various data for degradation diagnosis of the cell module circuit 30 can be found without a hindrance to the process by the control computer 80 during the operation of the battery apparatus. Therefore, degradation diagnosis of plural secondary cells can be executed while the safety of the operation of the large-scale battery apparatus is being maintained. In addition, by preferentially selecting a part of cell modules as the target of degradation diagnosis, the amount of various data for degradation diagnosis decreases. Thus, the processing load on the control computer 80 that is the output destination of the data can be reduced. Next, a description is given of another example of the degradation diagnosis of the cell module 30 by the measuring computer 90.

Figure 10:
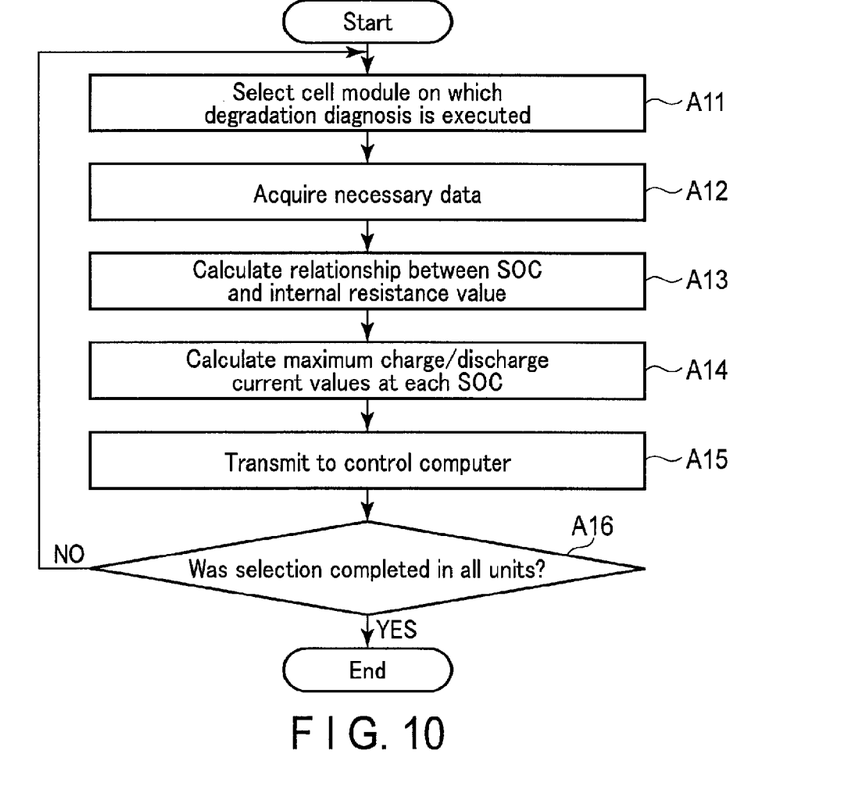
FIG. 10 is a flowchart illustrating another example of the process procedure by the measuring computer provided in the large-scale battery apparatus in the embodiment.

FIG. 10 is a flowchart illustrating another example of the process procedure by the measuring computer provided in the large-scale battery apparatus in the embodiment.

In order to correctly control the large-scale battery apparatus, the characteristic of the internal resistance value of the cell module circuit 30 is also important. To begin with, the control computer 80 selects the cell module 30-1, for instance, as a cell module of a target of degradation diagnosis (A11).

The control computer 80 successively acquires the data of the cell module 30-1 (the data of the current and the voltage of the cell module 30-1 in relation to each SOC, which is classified in association with respective temperature ranges) until a necessary number of data for diagnosing the cell module 30-1 that was selected in A1 is obtained (A12).

The calculation unit 92 of the measuring computer 90 calculates, with use of the data acquired in A12, SOC-internal resistance data which indicates the correspondency between the SOC of the cell module 30-1 and the internal resistance value at a time of charge or at a time of discharge (A13).

Further, the calculation unit 92 of the measuring computer 90 calculates, based on the above-described SOC-internal resistance data, a maximum charge current value and a maximum discharge current value at each SOC, which correspond to the internal resistance value of the cell module 30-1 (A14).

For example, the maximum charge current value at each SOC can be calculated by the following formula (1):

$$\text{(maximum allowable voltage of cell module 30-1} - \text{OCV of cell module 30-1)/internal resistance value at time of charge of cell module 30} \quad (1)$$

In addition, for example, the maximum discharge current value at each SOC can be calculated by the following formula (2):

$$\text{(OCV of cell module 30-1} - \text{minimum allowable voltage of cell module 30-1)/internal resistance value at time of discharge of cell module 30} \quad (2)$$

The output unit 93 of the measuring computer 90 transmits the SOC-internal resistance data and the data of the maximum charge current value and maximum discharge current value to the control computer 80 (A15).

If the selection of the cell module that is the diagnosis target is not completed in all assembled battery units 20 (NO in A16), the cell module that is the diagnosis target is selected from among the cell modules which have not been subjected to the determination of selection/nonselection (A16→A11). In this manner, by successively conducting degradation diagnosis of the cell module, the cell capacity of the cell module circuit 30 can be calculated.

In addition, here, it is assumed that the calculation unit 92 is executing the calculation of the residual capacity of the cell module, as described above. The output unit 93 of the measuring computer 90 also transmits the information of the residual capacity to the control computer 80. In this manner, since the control computer 80 can recognize the residual capacity, internal resistance value, charge-time maximum current and discharge-time maximum current of the cell module circuit 30, the operation of the PCS 14, which corresponds to these values, can be performed.

If the measuring computer 90 is connected to a communication network, the calculation for degradation diagnosis of the cell module circuit 30 can be remotely performed. Thus, even if the battery apparatus is operated unattended, it is possible to make a plan such as cell replacement due to an indication of a fault of the cell module circuit 30.

According to at least one of the above-described embodiments, there can be provided a battery apparatus which can perform degradation diagnosis of plural secondary cells, while maintaining the safety of the operation of the battery apparatus.

Specifically, it is possible to more exactly calculate the value of the SOC, which is difficult to exactly recognize because of the integration error or the transient characteristics of the cell voltage variation relative to the current. In addition, with use of the measuring computer, it is possible to correctly calculate (measure) the SOC, capacity, and charge-time internal resistance and discharge-time internal resistance in relation to the SOC. Moreover, it is possible to update the data of the battery management device 44 by the above-described data calculated by the measuring computer, and to set the state in which more exact SOC values can be calculated.

Furthermore, high-precision PCS control can be executed by sending, as upper-level device control information, the data of the corrected SOC, capacity and internal resistance characteristic calculated by the measuring computer.

Note that the method described in each of the aforementioned embodiments can be stored in a storage medium such as a magnetic disk (a Floppy® disk, a hard disk, or the like), an optical disk (a CD-ROM, a DVD, or the like), a magneto-optical disk (MO), or a semiconductor memory as a program executable by a computer, and can be distributed.

Any storage format may be adopted as long as the storage medium can store a program, and is readable by the computer.

An OS (Operating System) operating on the computer, MW (middleware) such as database management software or network software, or the like may execute part of each process for implementing the aforementioned embodiments based on the instruction of the program installed from the storage medium to the computer.

The storage medium according to each of the embodiments is not limited to a medium independent of the computer, and also includes a storage medium that stores or temporarily stores the program transmitted by a LAN, the Internet, or the like by downloading it.

The number of storage media is not limited to one. The storage medium according to the present invention also incorporates a case in which the processing of each of the aforementioned embodiments is executed from a plurality of media, and the media can have any arrangement. Note that the computer according to each of the embodiments is configured to execute each process of each of the aforementioned embodiments based on the program stored in the storage medium, and may be, for example, a single device formed from a personal computer or a system including a plurality of devices connected via a network.

The computer according to each of the embodiments is not limited to a personal computer, and also includes an arithmetic processing device or microcomputer included in an information processing apparatus. The term "computer" collectively indicates apparatuses and devices capable of implementing the functions of the present invention by the program.

While a certain embodiment has been described, this embodiment has been presented by way of example only, and is not intended to limit the scope of the inventions. Indeed, the novel embodiment described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications, e.g., the form of calculating the internal resistance value by the measuring computer 90, reading the internal resistance value, and executing the degradation diagnosis by the control computer 80, as would fall within the scope and spirit of the inventions.

What is claimed is:

1. A battery apparatus comprising:
   a plurality of assembled battery units, each of the assembled battery units including a cell module circuit in which a plurality of cell modules are connected in series, each of the cell modules including a plurality of cells which are connected in series and a cell monitoring unit configured to monitor voltages and temperatures of the plurality of cells; a current sensor for detecting a current flowing in the cell module circuit; and a battery management device configured to receive monitor data from each of the cell monitoring units, and detection data of the current sensor; and
   a measuring computer connected to the battery management devices in the plurality of assembled battery units, and configured to acquire detection data from the battery management device at first time intervals, to calculate a predetermined characteristic value of each cell or cell module, based on the acquired detection data, and to send the acquired detection data or the calculated characteristic value of the cell or cell module to an external control computer device at second time intervals which are longer than the first time intervals,
   wherein the battery apparatus is connectable to a power supply line of an external power system and is configured to transfer power between the external power system and the battery apparatus via an external power conditioner.

2. The battery apparatus of claim 1, wherein the measuring computer is configured to select, from among the cell modules, a cell module which is a target of degradation diagnosis, and to execute the degradation diagnosis of the selected cell module.

3. The battery apparatus of claim 1, wherein the measuring computer is configured to preferentially select, from among the cell modules, a cell module having a highest voltage at a time of charge or a lowest voltage at a time of discharge, as a cell module which is a target of degradation diagnosis, and to execute the degradation diagnosis of the selected cell module.

4. The battery apparatus of claim 1, wherein the measuring computer is configured to calculate a residual capacity, an internal resistance, a charge-time maximum current and a discharge-time maximum current of a cell module which is a target of degradation diagnosis, and to execute the degradation diagnosis, based on a result of the calculation.

5. A battery system comprising:
   a plurality of assembled battery units, each of the assembled battery units including a cell module circuit in which a plurality of cell modules are connected in series, each of the cell modules including a plurality of cells which are connected in series and a cell monitoring unit configured to monitor voltages and temperatures of the plurality of cells; a current sensor for detecting a current flowing in the cell module circuit; and a battery management device configured to receive monitor data from each of the cell monitoring units, and detection data of the current sensor;
   a measuring computer connected to battery management devices in the plurality of assembled battery units, and configured to acquire detection data from the battery management device at first time intervals, to calculate a predetermined characteristic value of each cell or cell module, based on the acquired detection data, and to send the acquired detection data or the calculated characteristic value of the cell or cell module to a control computer device at second time intervals which are longer than the first time intervals,
   the control computer device configured to communicate with the measuring computer, and to acquire the acquired detection data or the calculated characteristic value of the cell or cell module; and
   a power conditioner configured to connect to a power supply line of an external power system and to transfer power between the external power system and the plurality of assembled battery units.

* * * * *